(12) United States Patent
Chang et al.

(10) Patent No.: US 9,887,136 B2
(45) Date of Patent: Feb. 6, 2018

(54) SEMICONDUCTOR DEVICES, FINFET DEVICES, AND METHODS OF FORMING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/473,627

(22) Filed: Mar. 30, 2017

(65) Prior Publication Data

US 2017/0256458 A1    Sep. 7, 2017

Related U.S. Application Data

(63) Continuation-in-part of application No. 15/062,219, filed on Mar. 7, 2016, now Pat. No. 9,627,379.

(51) Int. Cl.
| | |
|---|---|
| *H01L 21/82* | (2006.01) |
| *H01L 21/8234* | (2006.01) |
| *H01L 27/088* | (2006.01) |
| *H01L 29/423* | (2006.01) |
| *H01L 29/66* | (2006.01) |

(52) U.S. Cl.
CPC ........ *H01L 21/823456* (2013.01); *H01L 21/823431* (2013.01); *H01L 27/0886* (2013.01); *H01L 29/42376* (2013.01); *H01L 29/66545* (2013.01)

(58) Field of Classification Search
CPC ......... H01L 27/0886; H01L 29/66545; H01L 29/0657; H01L 21/823431
See application file for complete search history.

(56) References Cited

U.S. PATENT DOCUMENTS 8,669,615 B1 *  3/2014  Chang ............... H01L 21/845
                                              257/347

\* cited by examiner

*Primary Examiner* — Roy Potter
*Assistant Examiner* — Paul Patton
(74) *Attorney, Agent, or Firm* — JCIPRNET (57) ABSTRACT

Semiconductor devices and FinFET devices are disclosed. A substrate has first and second regions. First and second gates are on the substrate in the first region, and a first end sidewall of the first gate is faced to a second end sidewall of the second gate. Third and fourth gates are on the substrate in the second region, and a third end sidewall of the third gate is faced to a fourth end sidewall of the fourth gate. A dielectric layer is between the first and second gates and between the third and fourth gates. The first and second regions have different pattern densities, and an included angle between the substrate and a sidewall of the dielectric layer between the first and second gates is different from an included angle between the substrate and a sidewall of the dielectric layer between the third and fourth gates.

20 Claims, 7 Drawing Sheets

SEMICONDUCTOR DEVICES, FINFET DEVICES, AND METHODS OF FORMING THE SAME

CROSS-REFERENCE TO RELATED APPLICATION

This application is a continuation application of and claims the priority benefit of U.S. application Ser. No. 15/062,219 filed Mar. 7, 2016, now allowed. The entirety of each of the above-mentioned patent applications is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects. For example, it is rather difficult to fill an insulating material between closely adjacent gates without generation of a void, and thus the performance of the FinFET devices is decreased. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1E are schematic cross-sectional views of a method of forming a FinFET device in accordance with some embodiments.

Figure 1A:
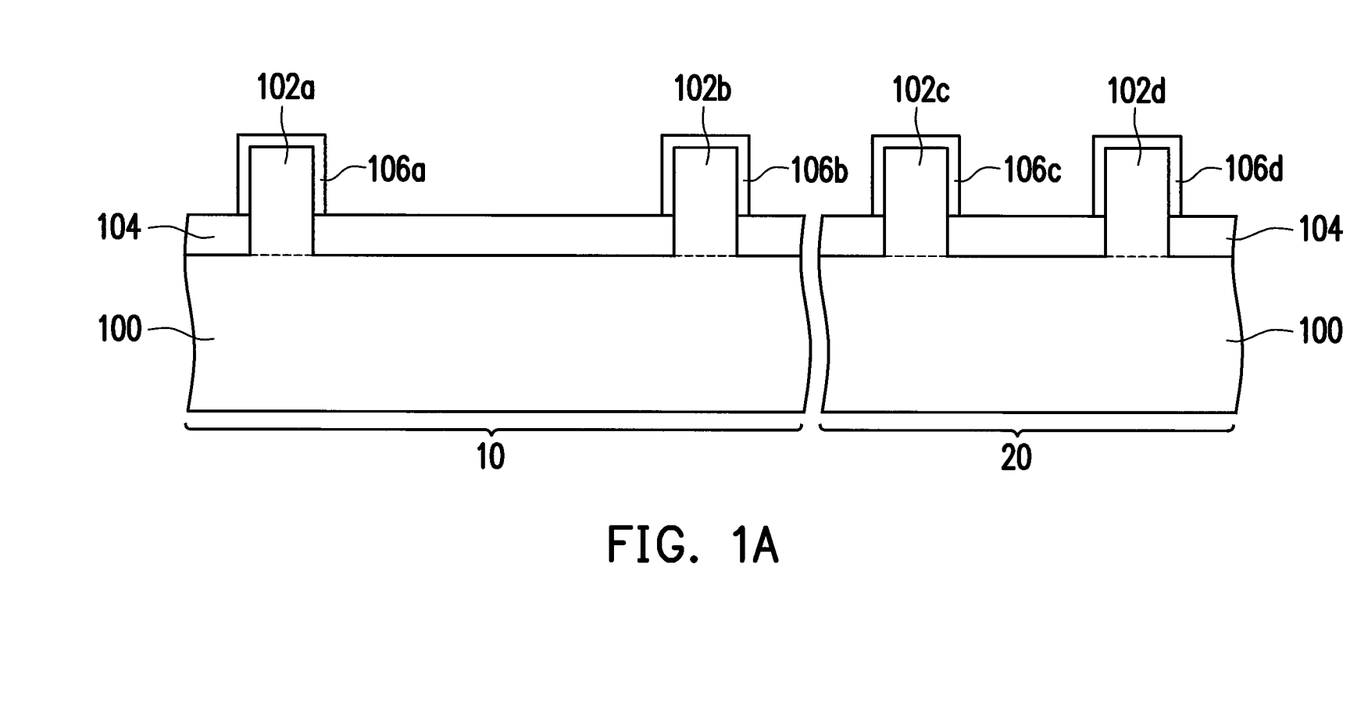
FIG. 1A to FIG. 1E are schematic cross-sectional views of a method of forming a FinFET device in accordance with some embodiments.

Referring to FIG. 1A, a substrate 100 with multiple separate fins 102a to 102d thereon is provided. In some embodiments, the substrate 100 is a semiconductor substrate, such as a silicon substrate, a silicon-on-insulator (SOI) substrate, a silicon germanium substrate, or a substrate formed of other suitable semiconductor materials. In some embodiments, the fins 102a to 102d extend in a first direction. In some embodiments, the fins 102a to 102d and the substrate 100 are made of the same material, such as silicon. In alternative embodiments, the fins 102a to 102d include a material different from that of the substrate 100. For example, the fins 102a to 102d include silicon germanium and the substrate 100 includes silicon. In some embodiments, the fins 102a to 102d have substantially the same widths and shapes, as shown in FIG. 1A. In alternative embodiments, the fins 102a to 102d have different widths and shapes upon the process requirements.

The substrate 100 has a first region 10 and a second region 20 adjacent to each other. In some embodiments, the pattern density of the first region 10 is different from the pattern density of the second region 20. In some embodiments, the pattern density is referred to a distance between two adjacent elements (e.g., a distance between two adjacent fins). In alternative embodiments, the pattern density is referred to a pitch (e.g., the feature line width plus the intermediate space between feature lines). In some embodiments, the pattern density of the first region 10 is less than the pattern density of the second region 20. For example, the first region 10 is a periphery region such as an input/output (I/O) region, and the second region 20 is a core region.

In some embodiments, at least one fin 102a and at least one fin 102b are provided in the first region 10, and at least one fin 102c and at least one fin 102d are provided in the second region 20. In some embodiments, the fin 102a and fin 102b are arranged side by side along the first direction, and the fin 102c and fin 102d are arranged side by side along the same direction.

Still referring to FIG. 1A, the substrate 100 further has an isolation layer 104 formed thereon. In some embodiments, the isolation layer 104 covers lower portions of the fins 102a to 102d and exposes upper portions of the fins 102a to 102d. In some embodiments, the isolation layer 104 is a shallow trench isolation (STI) structure. The isolation layer 104 includes a dielectric material such as silicon oxide. The fins 102a to 102d and the isolation layer 104 may be formed by using various suitable methods available in the art, such as a spacer double patterning technique (SDPT).

Thereafter, interfacial layers 106a to 106d are optionally formed on the upper portions of the fins 102a to 102d, respectively. In some embodiments, the interfacial layers 106a to 106d are formed by a thermal oxidation process and therefore disposed merely on the exposed surfaces of the upper portions of the fins 102a to 102d. In alternative embodiments, the interfacial layers 106a to 106d are formed by a deposition process and therefore disposed not only on the exposed surfaces of the upper portions of the fins 102a to 102d but also on the top surface of the isolation layer 104.

Figure 1B:
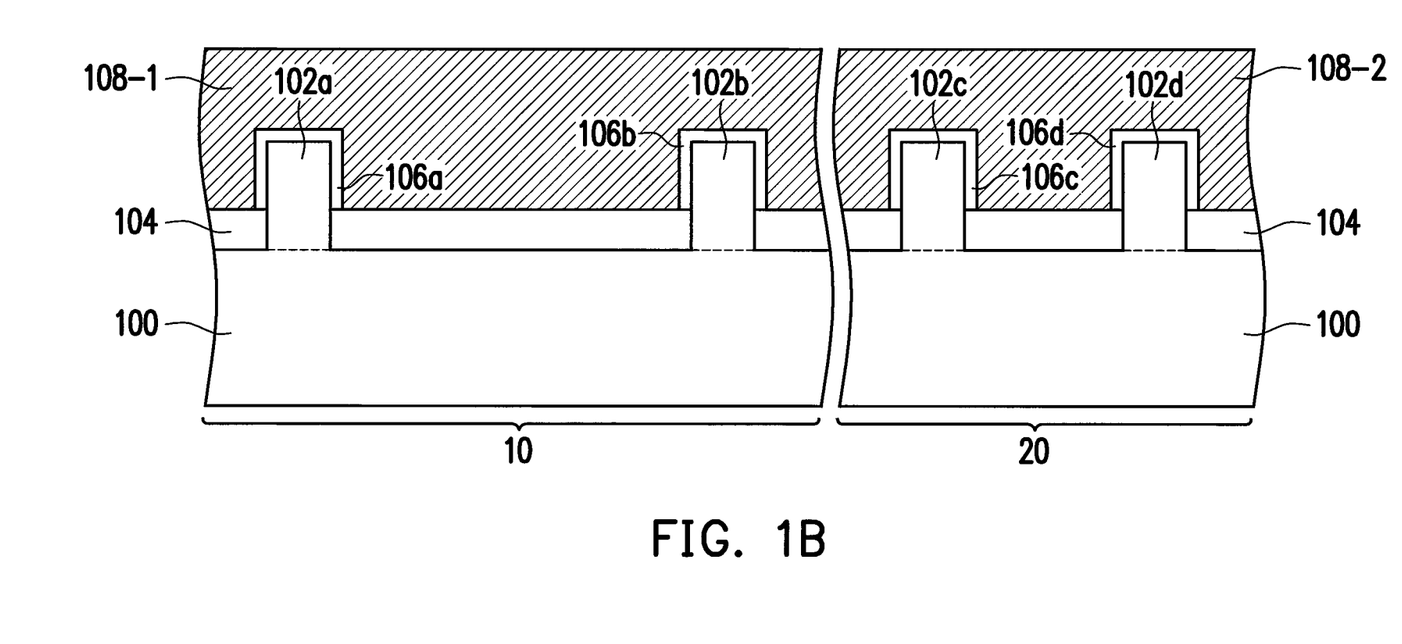

Referring to FIG. 1B, a dummy strip 108-1 is formed across the fins 102a and 102b in the first region 10 and a dummy strip 108-2 is formed across the fin 102c and 102d in the second region 20. In some embodiments, the dummy strips 108-1 and 108-2 extend in a second direction different from (e.g., perpendicular to) the first direction of the fins 102a to 102d. In some embodiments, the method of forming the dummy strips 108-1 and 108-2 includes forming a dummy layer (not shown) on the substrate 100 covering the fins 102a to 102d in the first and second regions 10 and 20. In some embodiments, the dummy layer includes a silicon-containing material, such as polysilicon, amorphous silicon or a combination thereof. The method of forming the dummy layer includes performing a suitable process such as PVD, CVD or ALD. The dummy layer is then patterned or partially removed. In some embodiments, mask strips (not shown) are formed on the dummy layer, and a portion of the dummy layer is removed by using the mask strips as an etch mask.

Figure 1C:
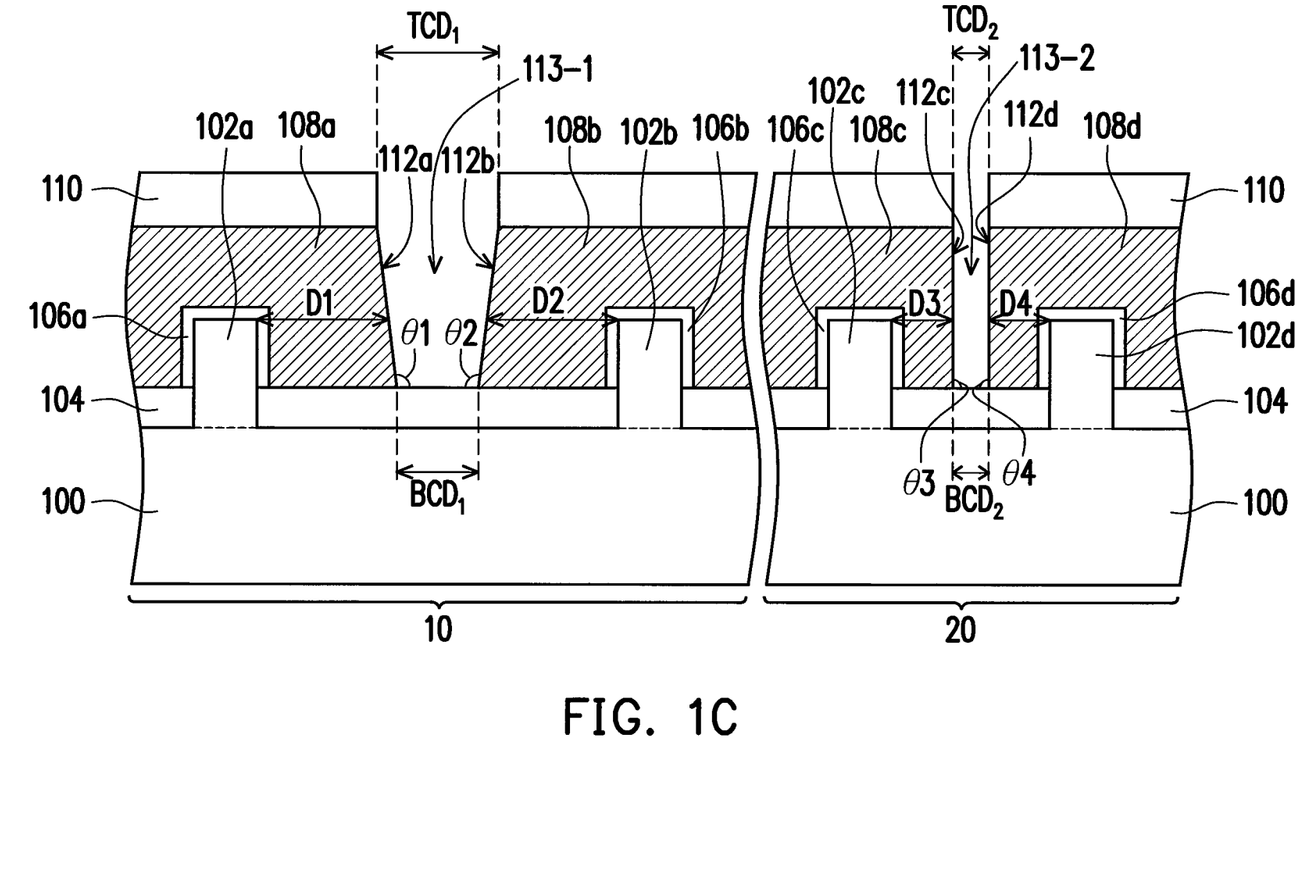

Referring to FIG. 1C, an end cut process is performed to the dummy strips 108-1 and 108-2 so as to form an opening 113-1 through the dummy strip 108-1 and an opening 113-2 through the dummy strip 108-2. In some embodiments, the end cut process includes forming a mask layer 110 on the substrate 100, and the mask layer exposes a portion of the dummy strip 108-1 and a portion of the dummy strip 108-2. In some embodiments, the mask layer 110 includes a photosensitive material, a dielectric material or a combination thereof. In some embodiments, the mask layer 110 is formed by a photolithography process. In alternative embodiments, the mask layer 110 is formed by a suitable process such as spin-coating, PVD, CVD, ALD or a combination thereof, and followed by photolithography etching processes. Thereafter, the portion of the dummy strip 108-1 and the portion of the dummy strip 108-2 are removed by using the mask layer 110 as an etch mask. The removing step includes performing at least one etching step.

In some embodiments, during the end cut process, the dummy strip 108-1 is divided into a dummy gate 108a across the fin 102a and a dummy gate 108b across the fin 102b in the first region 10, and the dummy strip 108-2 is divided into a dummy gate 108c across the fin 102c and a dummy gate 108d across the fin 102d in the second region 20. In some embodiments, the dummy gates 108a to 108d extend in a direction different from (e.g., perpendicular to) the extending direction of the fins 102a to 102d.

In some embodiments, the dummy gates 108a and 108b are arranged end to end, the end sidewall 112a of the dummy gate 108a is faced to the end sidewall 112b of the dummy gate 108b, and the opening 113-1 is formed between the opposite end sidewalls 112a and 112b of the dummy gates 108a and 108b. Similarly, the dummy gates 108c and 108d are arranged end to end, the end sidewall 112c of the dummy gate 108c is faced to the end sidewall 112d of the dummy gate 108d, and the opening 113-2 is formed between the opposite end sidewalls 112c and 112d of the dummy gates 108c and 108d.

It is noted that, upon the end cut process, the included angle $\theta 1$ or $\theta 2$ between the sidewall of the opening 113-1 (i.e. the end sidewall 112a or 112b of the dummy gates 108a or 108b) and the substrate 100 is different from the included angle $\theta 3$ or $\theta 4$ between the sidewall of the opening 113-2 (i.e. the end sidewall 112c or 112d of the dummy gates 108c or 108d) and the substrate 100. In some embodiments, the end cut process including at least one etching step is fine-tuned such that the included angle $\theta 1$ or $\theta 2$ is different from the included angle $\theta 3$ or $\theta 4$.

In some embodiments, the pattern density of the first region 10 is less than the pattern density of the second region 20, and the included angle $\theta 1$ or $\theta 2$ is greater than the included angle $\theta 3$ or $\theta 4$. In some embodiments, the included angle $\theta 1$ or $\theta 2$ can be, for example but is not limited to, greater than 90 degrees, greater than 95 degrees, greater than 100 degrees, greater than 105 degrees, greater than 110 degrees, or any value between any two of the preceding values or any range more than any one of the preceding values. In some embodiments, the included angle $\theta 3$ or $\theta 4$ can be, for example but is not limited to, 70 degrees, 75 degrees, 80 degrees, 85 degrees, 90 degrees, 95 degrees, or any value between any two of the preceding values.

In some embodiments, the included angle $\theta 1$ or $\theta 2$ is greater than 90 degrees, and the included $\theta 3$ or $\theta 4$ is from 85 to 95 degrees. In some embodiments, the included angle $\theta 1$ or $\theta 2$ is greater than 90 degrees, and the included $\theta 3$ or $\theta 4$ is substantially equal to 90 degrees.

In some embodiments, the included angle $\theta 1$ is substantially the same as the included angle $\theta 2$, and the included angle $\theta 3$ is substantially the same as the included angle $\theta 4$. However, the present disclosure is not limited thereto. In alternative embodiments, the included angle $\theta 1$ can be different from the included angle $\theta 2$, and the included angle $\theta 3$ can be different from the included angle $\theta 4$ upon the process requirements.

From another point of view, the end sidewalls 112a and 112b of the dummy gates 108a and 108b in the first region 10 are more tilted or inclined than the end sidewalls 112c and 112d of the dummy gates 108c and 108d in the second region 20. In some embodiments, the end sidewalls 112a and 112b of the dummy gates 108a and 108b are tilted or inclined with respect to the surface of the substrate 100, so as to form the opening 113-1 with wide top and narrow bottom between the facing end sidewalls 112a and 112b. Besides, the end sidewalls 112c and 112d of the dummy gates 108c and 108d are substantially perpendicular to surface of the substrate 100, so as to form the opening 113-2 with substantially vertical sidewall between the facing end sidewalls 112c and 112d. Specifically, the top dimension or top critical dimension TCD1 is greater than the bottom dimension or bottom critical dimension BCD1 of the opening 113-1, and the top dimension or top critical dimension TCD2 is substantially equal to the bottom dimension or the bottom critical dimension BCD2 of the opening 113-2.

In some embodiments, the dimension of the opening 113-1 is at least two times the dimension of the opening 113-2. In some embodiments, the top dimension or top critical dimension TCD1 of the opening 113-1 is at least two times the top dimension or top critical dimension TCD2 of the opening 113-2.

In some embodiments, the aspect ratio of the opening 113-2 is greater than the aspect ratio of the opening 113-1.

Herein, the aspect ratio of an opening is defined as the ratio of the longest side to the shortest side. For example, the aspect ratio of an opening is defined as the ratio of the height to the width. In some embodiments, the aspect ratio of the opening 113-2 is greater than about 3, greater than about 10, greater than 15 or even greater than about 20.

In some embodiments, the distance D1 (e.g., the shortest distance) from the end sidewall 112a of the dummy gate 108a to the sidewall of the fin 102a is at least two times the distance D3 from the end sidewall 112c of the dummy gate 108c to the sidewall of the fin 102c. In some embodiments, the distance D2 from the end sidewall 112b of the dummy gate 108b to the sidewall of the fin 102b is at least two times the distance D4 from the end sidewall 112d of the dummy gate 108d to the sidewall of the fin 102d.

In some embodiments, the distance D1 is substantially the same as the distance D2, and the distance D3 is substantially the same as the distance D4. However, the present disclosure is not limited thereto. In alternative embodiments, the distance D1 can be different from the distance D2, and the distance D3 can be different from the distance D4 upon the process requirements.

In some embodiments, after the formation of the dummy strips 108-1 and 108-2 and before the end cut process, spacers (not shown in this cross-section) are formed on the opposite sidewalls of each of the dummy strips 108-1 and 108-2. The spacers include a nitrogen-containing dielectric material, a carbon-containing dielectric material or both, and have a dielectric constant less than about 10, or even less than about 5. In some embodiments, the spacers include SiN, SiCN, SiOCN, SiOR (wherein R is an alkyl group such as $CH_3$, $C_2H_5$ or $C_3H_7$), SiC, SiOC, SiON, a combination thereof or the like. In some embodiments, the method of forming the spacers includes forming a spacer material layer on the substrate 100, and partially removing the spacer material layer by an anisotropic etching process.

In some embodiments, after the end cut process, two strained layers (not shown in this cross-section) are formed beside each of the dummy gates 108a to 108d. In some embodiments, the strained layers include silicon germanium (SiGe) for a P-type FinFET device. In alternative embodiments, the strained layers include silicon carbon (SiC), silicon phosphate (SiP), SiCP or a SiC/SiP multi-layer structure for an N-type FinFET device. In some embodiments, the strained layers may be optionally implanted with a P-type dopant or an N-type dopant as needed. In some embodiments, the method of forming the strained layers includes forming recesses in the fins 102a to 102d and growing epitaxy layers from the recesses.

Figure 1D:
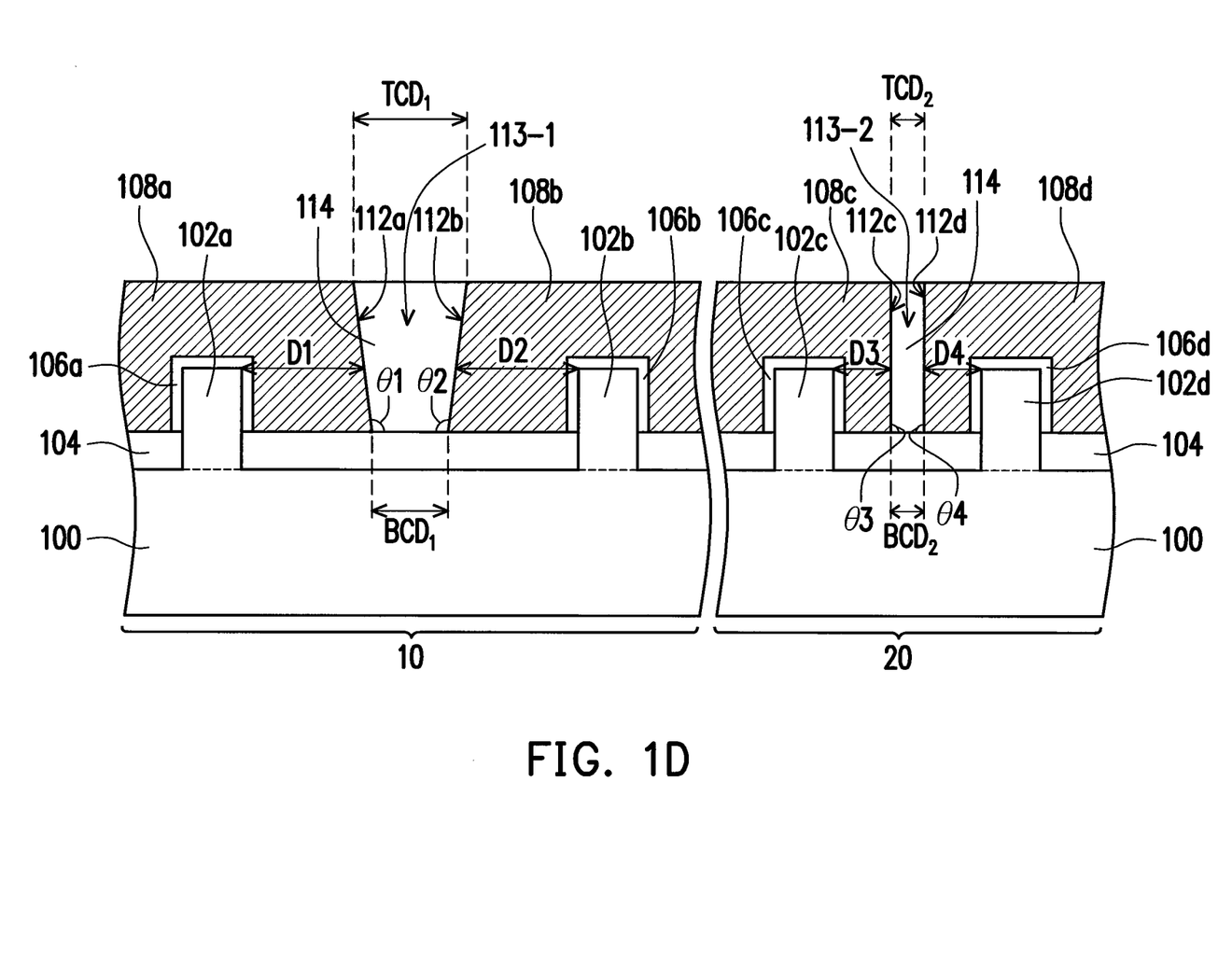

Referring to FIG. 1D, a dielectric layer 114 is formed in the openings 113-1 and 113-2. In some embodiments, the dielectric layer 114 is formed after the formation of the strained layers. In some embodiments, the dielectric layer 114 is formed around the dummy gates 108a to 108d and fills up the openings 113-1 and 113-2. The dielectric layer 114 includes nitride such as silicon nitride, oxide such as silicon oxide, phosphosilicate glass (PSG), borosilicate glass (BSG), boron-doped phosphosilicate glass (BPSG), a combination thereof or the like, and is formed by a suitable deposition technique such as spin-coating, chemical vapor deposition (CVD), flowable CVD, plasma-enhanced CVD (PECVD), atomic layer deposition (ALD), a combination thereof or the like. In some embodiments, the dielectric layer 114 may be filled until its top surface is higher than the top surfaces of dummy gates 108a to 108d. A planarization step such as CMP is then performed to remove excess dielectric layer 114. In some embodiments, the dummy gates 108a to 108d are used as a polish stop layer, so that the top surface of the dielectric layer 114 is substantially level with the top surfaces of dummy gates 108a to 108d.

In some embodiments, the facing ends of the dummy gates 108a and 108b are in physical contact with the dielectric layer 114, and the facing ends of the dummy gates 108c and 108d are in physical contact with the dielectric layer 114.

In some embodiments, the dielectric layer 114 in the openings 113-1 and 113-2 is a void-free dielectric material. In alternative embodiments, the dielectric layer 114 in at least one of the openings 113-1 and 113-2 may have a void therein.

Figure 1E:
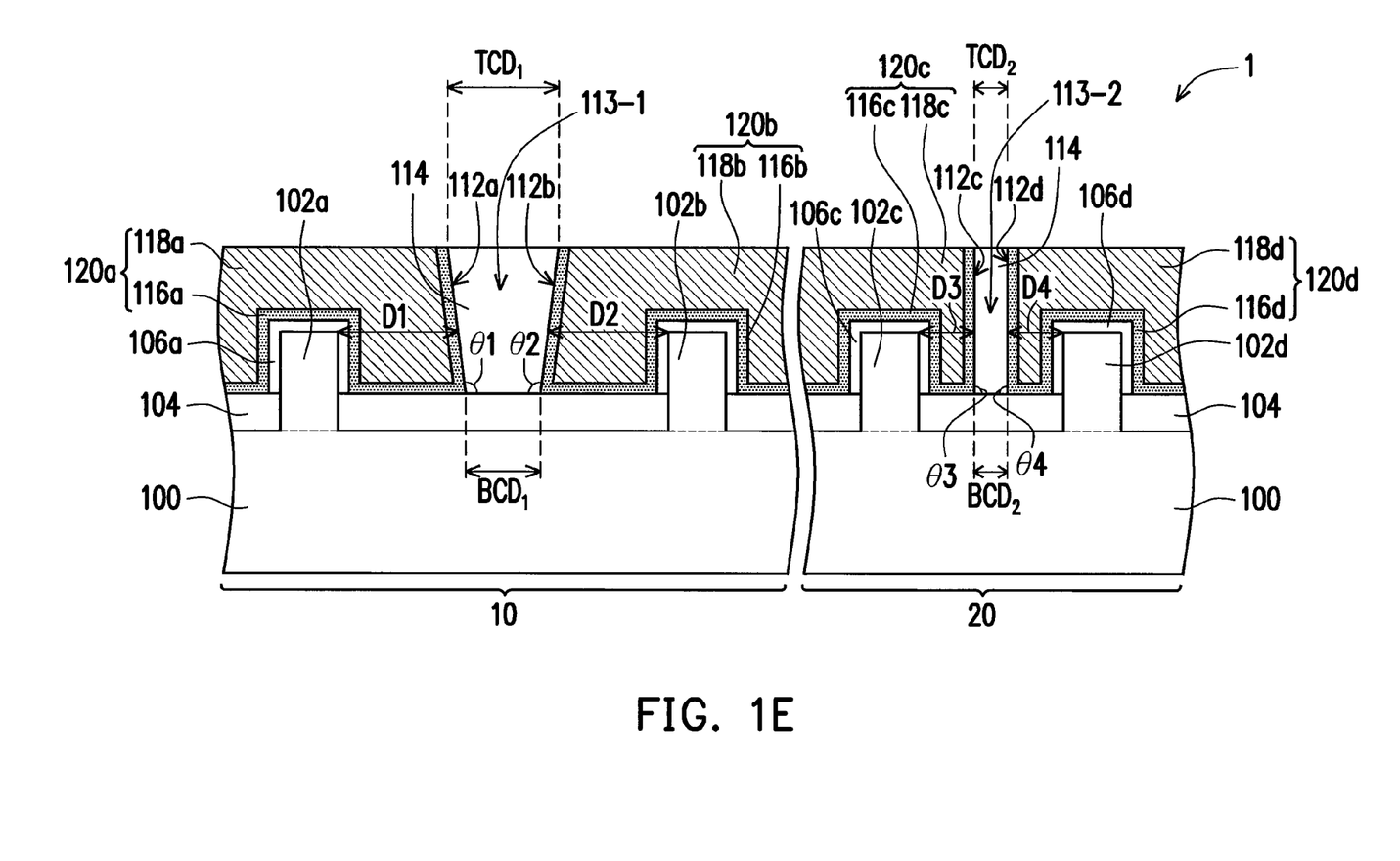

Referring to FIG. 1E, the dummy gates 108a to 108d are replaced with gates 120a to 120d. In some embodiments, the dummy gates 108a to 108d are removed to form trenches in the dielectric layer 114. In some embodiments, the removing step includes a suitable etching process by using the interfacial layers 106a to 106d as etch stop layers. Thereafter, gates 120a to 120d (or called "replacement gates") are formed in the trenches. In some embodiments, the gate 120a includes a gate dielectric layer 116a formed on the sidewall and bottom of the corresponding trench and on the top and sidewall of the fin 102a, and a metal layer 118a filling the remaining trench. The gate 120b includes a gate dielectric layer 116b formed on the sidewall and bottom of the corresponding trench and on the top and sidewall of the fin 102b, and a metal layer 118b filling the remaining trench. The gate 120c includes a gate dielectric layer 116c formed on the sidewall and bottom of the corresponding trench and on the top and sidewall of the fin 102c, and a metal layer 118c filling the remaining trench. The gate 120d includes a gate dielectric layer 116d formed on the sidewall and bottom of the corresponding trench and on the top and sidewall of the fin 102d, and a metal layer 118d filling the remaining trench.

Upon the step of FIG. 1E, the dummy gates 108a to 108d are replaced with gates 120a to 120d, so the end sidewalls 112a to 112d of the dummy gates 108a to 108d can be regarded as the end sidewalls 112a to 112d of the gates 120a to 120d.

In some embodiments, each of the gate dielectric layers 116a to 116d is in physical contact with the dielectric layer 114. In alternative embodiments, each of the gate dielectric layers 116a to 116d is not in physical contact with the dielectric layer 114 in the case that spacers are formed after the end cut process. In some embodiments, the gate dielectric layers 116a to 116d include silicon oxide, silicon oxyntirde, a dielectric material having a dielectric constant greater than 7 (referred to as "a high-k material" throughout the description), or a combination thereof. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material. The method of forming the gate dielectric layers 116a to 116d includes performing molecular-beam deposition (MBD), CVD, ALD, PVD, or the like.

In some embodiments, each of the metal layers 118a to 118d includes a work function metal layer and a fill metal layer on the work function metal layer. The work function metal layer is an N-type work function metal layer or a P-type work function metal layer. In some embodiments, the N-type work function metal layer includes TiAl, TiAlN, or TaCN, conductive metal oxide, and/or a suitable material. In alternative embodiments, the P-type work function metal layer includes TiN, WN, TaN, conductive metal oxide, and/or a suitable material. The fill metal layer includes copper, aluminum, tungsten, or a suitable material. In some embodiments, each of the metal layers 118a to 118d can further include a liner layer, an interface layer, a seed layer, an adhesion layer, a barrier layer, a combination thereof or the like. The FinFET device 1 of the disclosure is thus completed.

Figure 2:
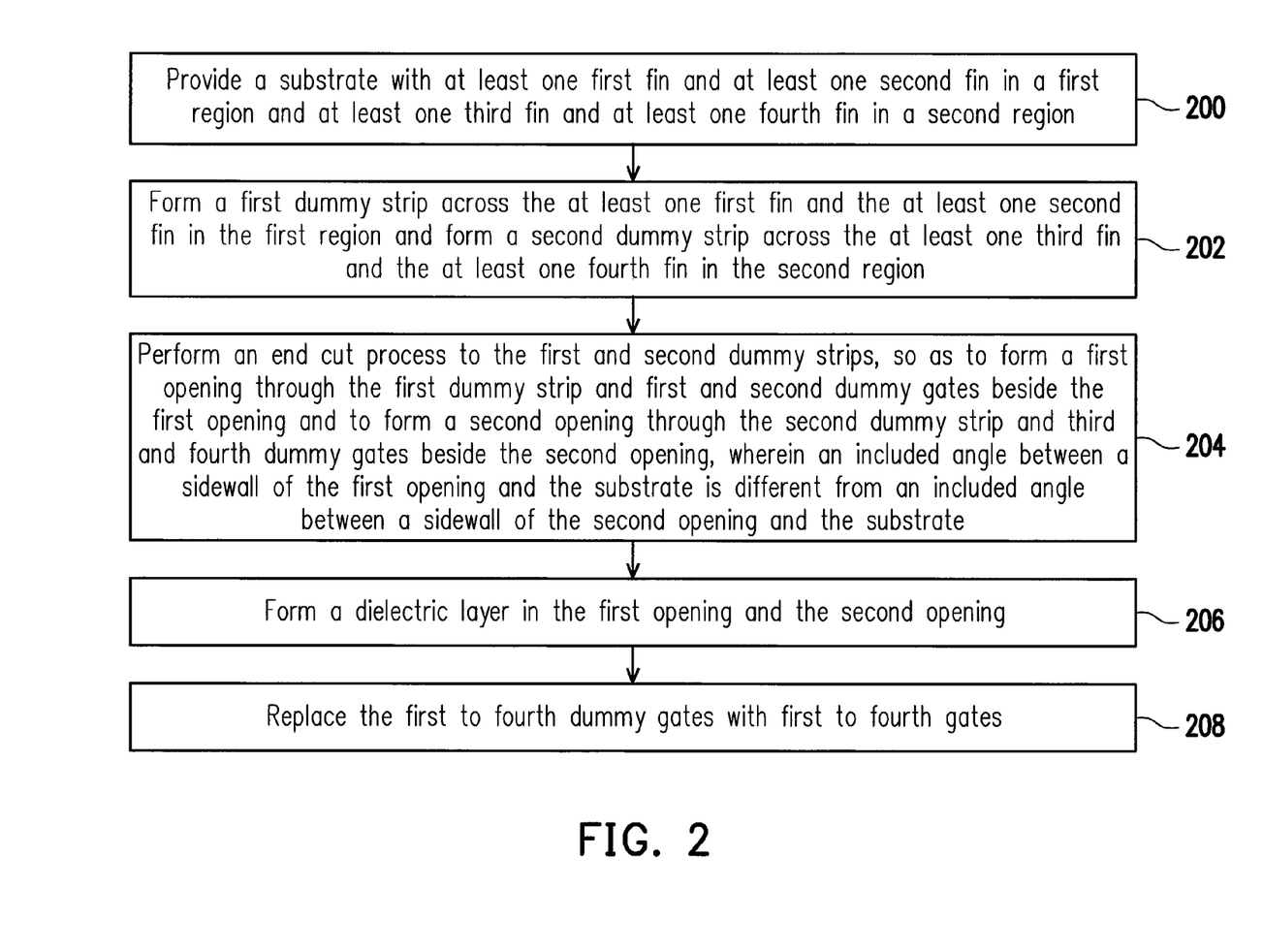
FIG. 2 is a flow chart of a method of forming a FinFET device in accordance with some embodiments.

The above-mentioned process steps in FIG. 1A to 1E can be concisely illustrated with reference to the flow chart of FIG. 2.

At step 200, a substrate 100 is provided with at least one first fin (e.g., fin 102a) and at least one second fin (e.g., fin 102b) in a first region 10 and at least one third fin (e.g., fin 102c) and at least one fourth fin (e.g., fin 102d) in a second region 20, as shown in FIG. 1A.

At step 202, a first dummy strip (e.g., dummy strip 108-1) is formed across the at least one first fin (e.g., fin 102a) and the at least one second fin (e.g., fin 102b) in the first region 10, and a second dummy strip (e.g., dummy strip 108-2) is formed across the at least one third fin (e.g., fin 102c) and the at least one fourth fin (e.g., fin 102d) in the second region 20, as shown in FIG. 1B.

At step 204, an end cut process is performed to the first and second dummy strips (e.g., dummy strips 108-1 and 108-2), so as to form a first opening (e.g., opening 113-1) through the first dummy strip (e.g., dummy strip 108-1) and first and second dummy gates (e.g., dummy gates 108a and 108b) beside the first opening (e.g., opening 113-1), and to form a second opening (e.g., opening 113-2) through the second dummy strip (e.g., dummy strip 108-2) and third and fourth dummy gates (e.g., dummy gates 108c and 108d) beside the second opening (e.g., opening 113-2), as shown in FIG. 1C. It is noted that, the first and second openings (e.g., openings 113-1 and 113-2) are formed with different profiles upon the end cut process. Specifically, the included angle θ1 or θ2 between the sidewall of the first opening (e.g., opening 113-1) and the substrate 100 is different from the included angle θ3 or θ4 between the sidewall of the second opening (e.g., opening 113-2) and the substrate 100.

At step 206, a dielectric layer 114 is formed in the first opening and the second opening (e.g., openings 113-1 and 113-2), as shown in FIG. 1D.

At step 208, the first to fourth dummy gates (e.g., dummy gates 108a to 108d) are replaced with first to fourth gates (e.g., gates 120a to 120d), as shown in FIG. 1E. The FinFET device of the disclosure is thus completed with the described process steps. However, it is not limited to add one or more additional steps among the above steps for fabricating the FinFET device.

In some embodiments, as shown in FIG. 1E, the FinFET device includes a substrate 100 with fins 102a and 102b in a first region 10 and fins 102c and 102d in a second region 20, gates 120a to 120d respectively across the fins 102a to 102d and a dielectric layer 114. The end sidewall 112a of the gate 120a is faced to the end sidewall 112b of the gate 120b, and an opening 113-1 is formed between the end sidewalls 112a and 112b. The end sidewall 112c of the gate 120c is faced to the end sidewall 112d of the gate 120d, and an opening 113-2 is formed between the end sidewalls 112c and 112d. The dielectric layer 114 is in the openings 113-1 and 113-2.

In some embodiments, the pattern density of the first region 10 is different from the pattern density of the second region 20, and the included angle θ1 or θ2 between the sidewall of the opening 113-2 and the substrate 100 is different from the included angle θ3 or θ4 between the sidewall of the opening 113-2 and the substrate 100.

In some embodiments, the first region 10 is a periphery region and the second region 20 is a core region, so the pattern density of the first region 10 is less than the pattern density of the second region 20. In such case, the included angle θ1 or θ2 is greater than the included angle θ3 or θ4. For example, the included angle θ1 or θ2 is greater than 90 degrees, and the included angle θ3 or θ4 is from 85 to 95 degrees. Specifically, the top critical dimension TCD1 is greater than the bottom critical dimension BCD1 of the opening 113-1, and the top critical dimension TCD2 is substantially equal to the bottom critical dimension BCD2 of the opening 113-2. In some embodiments, the aspect ratio of the opening 113-2 is greater than the aspect ratio of the opening 113-1.

In some embodiments, the distance D1 from the end sidewall 112a of the gate 120a to the sidewall of the fin 102a is at least two times the distance D3 from the end sidewall 112c of the gate 120c to the sidewall of the fin 102c, and the distance D2 from the end sidewall 112b of the gate 120b to the sidewall of the fin 102b is at least two times the distance D4 from the end sidewall 112d of the gate 120d to the sidewall of the fin 102d.

Figure 3:
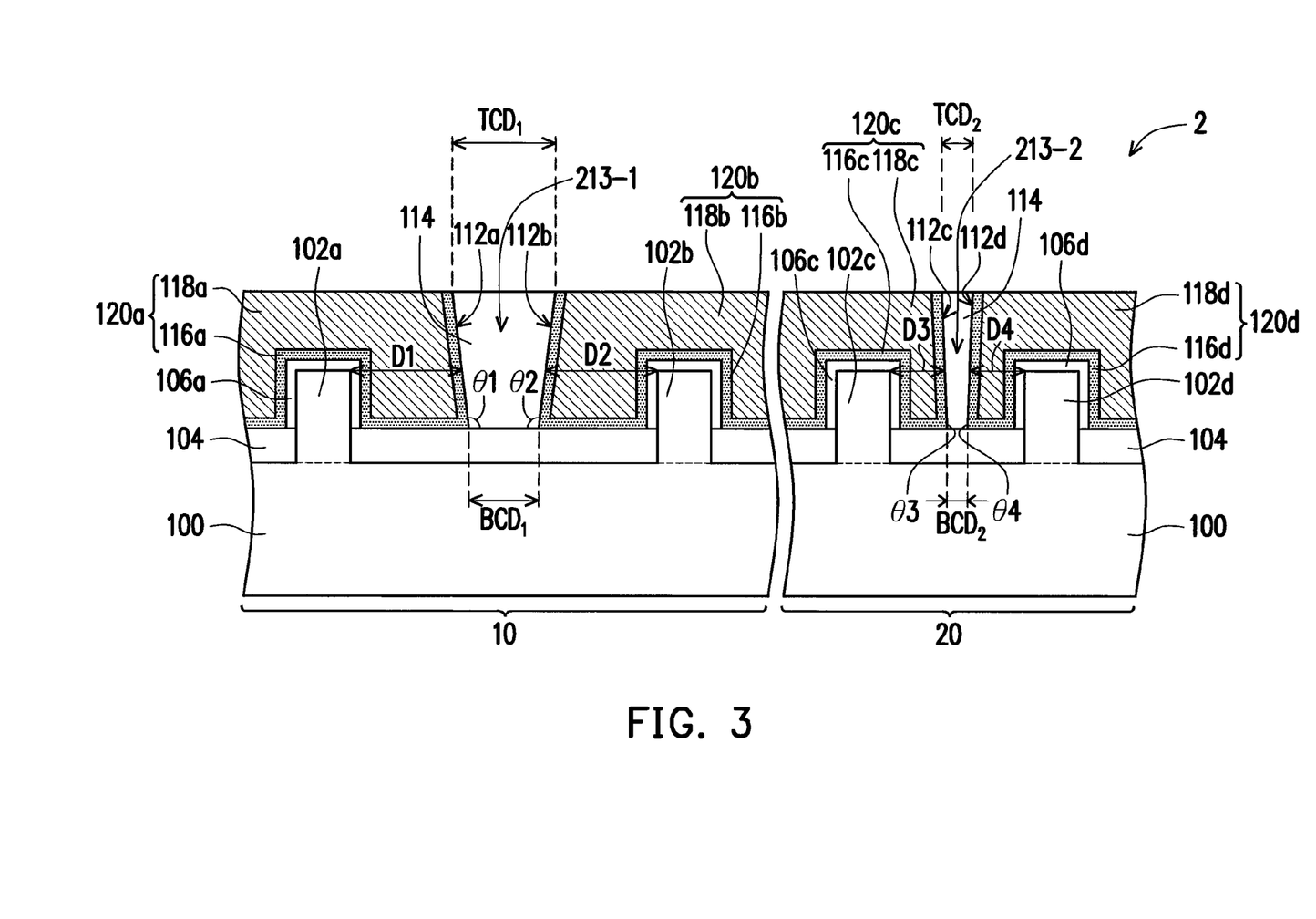
FIG. 3 is a schematic cross-sectional view of a FinFET device in accordance with some embodiments.

In the embodiments of FIG. 1E in which the opening 113-2 in the pattern-dense region (e.g., the second region 20) has a substantially vertical sidewall while the opening 113-1 in the pattern-sparse region (e.g., the first region 10) has an inclined sidewall are provided for illustration purposes, and are not construed as limiting the present disclosure. In alternative embodiments, as shown in the FinFET device 2 in FIG. 3, the opening 213-2 in the pattern-dense region (e.g., the second region 20) can have a slightly tilted sidewall as long as the distance D3/D4 from the end sidewall 112c/112d of the gate 120c/120d to the sidewall of the adjacent fin 102c/102d is wide enough to allow the gates 120c/120d to be filled without merging the high-k layer and/or the work function metal layer at the line end. In such case, the opening 213-1 in the pattern-sparse region (e.g., the second region 10) has a sidewall more tilted than that of the opening 213-2 in the pattern-dense region (e.g., the second region 20).

The above embodiments in which each of the interfacial layers, the gate dielectric layers, the metal layers and the dielectric layer is a single layer are provided for illustration purposes, and are not construed as limiting the present disclosure. In some embodiments, at least one of these described elements can be a multi-layer structure as needed.

In the above-mentioned embodiments, a "gate last" process is implemented to form a FinFET device. However, another process such as a "gate first" process or another type of device (e.g., planar device) can be applied by using similar processes as described herein. The methods disclosed herein can be easily integrated with a CMOS process flow and do not require additional complicated steps to achieve the desired results. It is understood that embodiments disclosed herein offer different advantages, and that no particular advantage is necessarily required for all embodiments.

In view of the above, in some embodiments, the openings respectively in the periphery and core regions are formed with different profiles during the line end cut process. By such manner, the device yield is improved and the reliability/leakage window is enlarged. Specifically, the opening sandwiched between the end-to-end gates in the periphery region is provided with an inclined sidewall so as to improve the filling property of the subsequent dielectric material. On the other hand, the opening sandwiched between the end-to-end gates in the core region is provided with a substantially vertical sidewall so as to provide enough window for filling the high-k layer and/or the work function metal layer at the line ends, thus leading to uniform electrical performance and better reliability of the device. Accordingly, the wafer acceptance test (WAT) results and the uniformity performance of the device can be enhanced.

In accordance with some embodiments of the present disclosure, a FinFET device includes a substrate having at least one first fin and at least one second fin in a first region and having at least one third fin and at least one fourth fin in a second region, and first to fourth gates respectively across the first to fourth fins. A first end sidewall of the first gate is faced to a second end sidewall of the second gate, and a first opening is formed between the first and second end sidewalls of the first and second gates. A third end sidewall of the third gate is faced to a fourth end sidewall of the fourth gate, and a second opening is formed between the third and fourth end sidewalls of the third and fourth gates. Besides, a pattern density of the first region is different from a pattern density of the second region, and an included angle between a sidewall of the first opening and the substrate is different from an included angle between a sidewall of the second opening and the substrate.

In accordance with alternative embodiments of the present disclosure, a FinFET device includes a substrate having at least one first fin and at least one second fin in a first region and having at least one third fin and at least one fourth fin in a second region, and first to fourth gates respectively across the first to fourth fins. A first end sidewall of the first gate is faced to a second end sidewall of the second gate, and a first opening is formed between the first and second end sidewalls of the first and second gates. A third end sidewall of the third gate is faced to a fourth end sidewall of the fourth gate, and a second opening is formed between the third and fourth end sidewalls of the third and fourth gates. Besides, a distance from the first end sidewall of the first gate to a sidewall of the at least one first fin is at least two times a distance from the third end sidewall of the third gate to a sidewall of the at least one third fin, and a top dimension is greater than a bottom dimension of the first opening.

In accordance with yet alternative embodiments of the present disclosure, a method of forming a FinFET device includes at least the following steps. Provided is a substrate with at least one first fin and at least one second fin in a first region and at least one third fin and at least one fourth fin in a second region. A first dummy strip is formed across the at least one first fin and the at least one second fin in the first region, and a second dummy strip is formed across the at least one third fin and the at least one fourth fin in the second region. An end cut process is performed to the first and second dummy strips, so as to form a first opening through the first dummy strip and a second opening through the second dummy strip, wherein an included angle between a sidewall of the first opening and the substrate is different from an included angle between a sidewall of the second opening and the substrate. A dielectric layer is formed in the first opening and the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a first region and a second region;
   a first gate and a second gate on the substrate in the first region, wherein a first end sidewall of the first gate is faced to a second end sidewall of the second gate;
   a third gate and a fourth gate on the substrate in the second region, wherein a third end sidewall of the third gate is faced to a fourth end sidewall of the fourth gate; and
   a dielectric layer between the first end sidewall of the first gate and the second end sidewall of the second gate and between the third end sidewall of the third gate and the fourth end sidewall of the fourth gate,
   wherein a pattern density of the first region is different from a pattern density of the second region, and an included angle between the substrate and a sidewall of the dielectric layer between the first gate and the second gate is different from an included angle between the substrate and a sidewall of the dielectric layer between the third gate and the fourth gate.

2. The semiconductor device of claim 1, wherein the pattern density of the first region is less than the pattern density of the second region, and the included angle between the substrate and the sidewall of the dielectric layer between the first gate and the second gate is greater than the included angle between the substrate and the sidewall of the dielectric layer between the third gate and the fourth gate.

3. The semiconductor device of claim 2, wherein the included angle between the substrate and the sidewall of the dielectric layer between the first gate and the second gate is greater than 90 degrees, and the included angle between the substrate and the sidewall of the dielectric layer between the third gate and the fourth gate is from 85 to 95 degrees.

4. The semiconductor device of claim 1, wherein the first region is a periphery region, and the second region is a core region.

5. The semiconductor device of claim 1, wherein a distance from the first end sidewall of the first gate to the second end sidewall of the second gate is greater than a distance from the third end sidewall of the third gate to the fourth end sidewall of the fourth gate.

6. The semiconductor device of claim 1, wherein a top surface of the dielectric layer is substantially level with top surfaces of the first gate to fourth gates.

7. The semiconductor device of claim 1, further comprising a void in at least one of a part of the dielectric layer between the first end sidewall of the first gate and the second end sidewall of the second gate and another part of the dielectric layer between the third end sidewall of the third gate and the fourth end sidewall of the fourth gate.

8. The semiconductor device of claim 1, wherein the substrate has at least one first fin and at least one second fin in the first region and has at least one third fin and at least one fourth fin in the second region, and wherein the first gate is across the at least one first fin and the second gate is across the at least one second fin, and the third gate is across the at least one third fin and the fourth gate is across the at least one fourth fin.

9. A FinFET device, comprising:
   a substrate having at least one first fin and at least one second fin in a first region and having at least one third fin and at least one fourth fin in a second region;

a first gate across the at least one first fin and a second gate across the at least one second fin, wherein a first end sidewall of the first gate is faced to a second end sidewall of the second gate;

a third gate across the at least one third fin and a fourth gate across the at least one fourth fin, wherein a third end sidewall of the third gate is faced to a fourth end sidewall of the fourth gate; and a dielectric layer between the first end sidewall of the first gate and the second end sidewall of the second gate and between the third end sidewall of the third gate and the fourth end sidewall of the fourth gate, wherein a distance from the first end sidewall of the first gate to a sidewall of the at least one first fin is at least two times a distance from the third end sidewall of the third gate to a sidewall of the at least one third fin, and the dielectric layer between the first end sidewall of the first gate and the second end sidewall of the second gate has a cross-sectional profile different from that of the dielectric layer between the third end sidewall of the third gate and the fourth end sidewall of the fourth gate.

10. The FinFET device of claim 9, wherein the dielectric layer between the first end sidewall of the first gate and the second end sidewall of the second gate has a wide top and narrow bottom profile.

11. The FinFET device of claim 9, wherein a distance from the second end sidewall of the second gate to a sidewall of the at least one second fin is at least two times a distance from the fourth end sidewall of the fourth gate to a sidewall of the at least one fourth fin.

12. The FinFET device of claim 9, wherein an included angle between the substrate and a sidewall of the dielectric layer between the first gate and the second gate is different from an included angle between the substrate and a sidewall of the dielectric layer between the third gate and the fourth gate.

13. The FinFET device of claim 9, wherein the first region is a periphery region, and the second region is a core region.

14. The FinFET device of claim 9, wherein a distance from the first end sidewall of the first gate to the second end sidewall of the second gate is greater than a distance from the third end sidewall of the third gate to the fourth end sidewall of the fourth gate.

15. The FinFET device of claim 9, wherein a top surface of the dielectric layer is substantially level with top surfaces of the first gate to fourth gates.

16. A method of forming a FinFET device, comprising:
providing a substrate with at least one first fin and at least one second fin in a first region and at least one third fin and at least one fourth fin in a second region;

forming a first dummy strip across the at least one first fin and the at least one second fin in the first region and forming a second dummy strip across the at least one third fin and the at least one fourth fin in the second region;

performing an end cut process to the first and second dummy strips, so as to form a first opening through the first dummy strip and a second opening through the second dummy strip, wherein a cross-sectional profile of the first opening is different from a cross-sectional profile of the second opening; and forming a dielectric layer in the first opening and the second opening.

17. The method of claim 16, wherein an included angle between a sidewall of the first opening and the substrate is different from an included angle between a sidewall of the second opening and the substrate.

18. The method of claim 17, wherein a pattern density of the first region is less than a pattern density of the second region, and the included angle between the sidewall of the first opening and the substrate is greater than the included angle between the sidewall of the second opening and the substrate.

19. The method of claim 16, wherein the end cut process comprises:
forming a mask layer on the substrate, wherein the mask layer exposes a portion of the first dummy strip and a portion of the second dummy strip; and removing the portion of the first dummy strip and the portion of the second dummy strip by using the mask layer as an etch mask.

20. The method of claim 16, wherein during the end cut process,
the first dummy strip is divided into a first dummy gate across the at least one first fin and a second dummy gate across the at least one second fin, wherein a first end sidewall of the first dummy gate is faced to a second end sidewall of the second dummy gate, and the second dummy strip is divided into a third dummy gate across the at least one third fin and a fourth dummy gate across the at least one fourth fin, wherein a third end sidewall of the third dummy gate is faced to a fourth end sidewall of the fourth dummy gate.

* * * * *